(12) United States Patent
Parekh

(10) Patent No.: US 11,380,669 B2
(45) Date of Patent: Jul. 5, 2022

(54) METHODS OF FORMING MICROELECTRONIC DEVICES

(71) Applicant: Micron Technology, Inc., Boise, ID (US)

(72) Inventor: Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/905,734

(22) Filed: Jun. 18, 2020

(65) Prior Publication Data

US 2021/0398967 A1 Dec. 23, 2021

(51) Int. Cl.
*H01L 25/00* (2006.01)
*H01L 27/11556* (2017.01)
*H01L 27/11582* (2017.01)

(52) U.S. Cl.
CPC ........ *H01L 25/50* (2013.01); *H01L 27/11556* (2013.01); *H01L 27/11582* (2013.01)

(58) Field of Classification Search
CPC ............... H01L 25/50; H01L 27/00556; H01L 27/11582
See application file for complete search history.

(56) References Cited

U.S. PATENT DOCUMENTS

| | | | |
|---|---|---|---|
| 4,925,809 A | 5/1990 | Yoshiharu et al. | |
| 6,165,247 A * | 12/2000 | Kodas | C09K 3/1436 75/10.39 |
| 7,372,091 B2 | 5/2008 | Leslie | |
| 7,897,485 B2 | 3/2011 | Parekh | |
| 8,042,082 B2 | 10/2011 | Solomon | |
| 8,958,228 B2 | 2/2015 | Samachisa et al. | |
| 9,196,753 B2 | 11/2015 | Ramaswamy et al. | |
| 9,397,145 B1 | 7/2016 | Sills et al. | |
| 9,449,652 B2 | 9/2016 | Juengling | |
| 9,515,083 B2 | 12/2016 | Lee et al. | |
| 9,530,790 B1 | 12/2016 | Lu et al. | |
| 9,553,263 B1 | 1/2017 | Petz et al. | |
| 9,590,012 B2 | 3/2017 | Lee et al. | |
| 9,653,617 B2 | 5/2017 | Zhou et al. | |

(Continued)

FOREIGN PATENT DOCUMENTS

| | | |
|---|---|---|
| JP | 2002-103299 A | 4/2002 |
| KR | 10-2009-0034570 A | 4/2009 |

(Continued)

OTHER PUBLICATIONS

Choe et al., YMTC is China's First Mass Producer of 3D NAND Flash Memory Chips, https://www.techinsights.com/blog/ymtc-chinas-first-mass-producer-3d-nand-flash-memory-chips, (Mar. 12, 2020), 3 pages.

(Continued)

*Primary Examiner* — Thao P Le
(74) *Attorney, Agent, or Firm* — TraskBritt

(57) ABSTRACT

A method of forming a microelectronic device comprises forming a source material around substantially an entire periphery of a base material, and removing the source material from lateral sides of the base material while maintaining the source material over an upper surface and a lower surface of the base material. Related methods and base structures for microelectronic devices are also described.

20 Claims, 10 Drawing Sheets

(56) References Cited

U.S. PATENT DOCUMENTS

| | | |
|---|---|---|
| 9,922,716 B2 | 3/2018 | Hsiung et al. |
| 10,283,703 B2 | 5/2019 | Pellizzer et al. |
| 10,381,362 B1 | 8/2019 | Cui et al. |
| 10,665,580 B1 | 5/2020 | Hosoda et al. |
| 10,847,220 B2 | 11/2020 | Castro |
| 2003/0113669 A1 | 6/2003 | Cheng et al. |
| 2003/0151083 A1 | 8/2003 | Matsui et al. |
| 2005/0265076 A1 | 12/2005 | Forbes |
| 2006/0076690 A1 | 4/2006 | Khandros et al. |
| 2007/0288702 A1 | 12/2007 | Roohparvar |
| 2009/0168482 A1 | 7/2009 | Park et al. |
| 2011/0159645 A1 | 6/2011 | Pekny |
| 2012/0161094 A1 | 6/2012 | Huo et al. |
| 2013/0126622 A1* | 5/2013 | Finn ................ H05K 3/103 29/601 |
| 2013/0130468 A1 | 5/2013 | Higashitani et al. |
| 2014/0001583 A1* | 1/2014 | Teh ................ B81B 3/0005 257/417 |
| 2014/0124726 A1 | 5/2014 | Oh |
| 2014/0175637 A1 | 6/2014 | Stuber et al. |
| 2015/0091180 A1* | 4/2015 | Ong ................ H01L 24/19 257/774 |
| 2015/0243708 A1 | 8/2015 | Ravasio et al. |
| 2015/0278675 A1* | 10/2015 | Finn ................ G06K 19/07783 29/601 |
| 2016/0104715 A1 | 4/2016 | Pachamuthu et al. |
| 2016/0268304 A1 | 9/2016 | Ikeda et al. |
| 2016/0343727 A1 | 11/2016 | Kim et al. |
| 2017/0054036 A1 | 2/2017 | Dorhout et al. |
| 2017/0092649 A1 | 3/2017 | Takaoka |
| 2017/0148802 A1 | 5/2017 | Dorhout et al. |
| 2018/0108741 A1 | 4/2018 | Li et al. |
| 2018/0158689 A1 | 6/2018 | Mumford |
| 2019/0043836 A1 | 2/2019 | Fastow et al. |
| 2019/0096906 A1 | 3/2019 | Lindsay et al. |
| 2019/0206861 A1 | 7/2019 | Beigel et al. |
| 2019/0221557 A1 | 7/2019 | Kim et al. |
| 2019/0229089 A1* | 7/2019 | Zhou ................ H01L 23/552 |
| 2019/0355786 A1* | 11/2019 | Iguchi ................ H01L 33/24 |
| 2020/0006380 A1* | 1/2020 | Van Houdt ............ H01L 45/124 |
| 2020/0013792 A1 | 1/2020 | Parekh et al. |
| 2020/0013798 A1 | 1/2020 | Parekh |
| 2020/0066745 A1 | 2/2020 | Yu et al. |
| 2020/0135541 A1* | 4/2020 | Wu ................ H01L 21/76256 |
| 2020/0159133 A1 | 5/2020 | Yan et al. |
| 2020/0219815 A1* | 7/2020 | Elsherbini ............ H01L 23/13 |
| 2020/0227397 A1 | 7/2020 | Yada et al. |
| 2020/0258816 A1 | 8/2020 | Okina et al. |
| 2020/0258876 A1 | 8/2020 | Hosoda et al. |
| 2020/0273840 A1* | 8/2020 | Elsherbini ............ H01L 23/3675 |
| 2021/0074711 A1* | 3/2021 | Suzuki ................ H01L 27/11575 |
| 2021/0082939 A1* | 3/2021 | Matsuda ............ H01L 27/11556 |
| 2021/0296316 A1* | 9/2021 | Zhu ................ H01L 29/66666 |
| 2021/0343690 A1* | 11/2021 | Salmon ................ H01L 23/473 |
| 2022/0028830 A1* | 1/2022 | Kirby ................ H01L 25/18 |

FOREIGN PATENT DOCUMENTS

| | | |
|---|---|---|
| KR | 10-2014-0117062 A | 10/2014 |
| KR | 10-2015-0085155 A | 7/2015 |
| KR | 10-2020-0008606 A | 1/2020 |
| KR | 10-2020-0037444 A | 4/2020 |
| TW | 201826556 A | 7/2018 |
| TW | 201941407 B | 10/2019 |
| TW | 201946057 A | 12/2019 |
| TW | 202008568 B | 2/2020 |
| WO | 2008/063251 A2 | 5/2008 |

OTHER PUBLICATIONS

Li et al., Skybridge-3D-CMOS: A Fine-Grained 3D CMOS Integrated Circuity Technology, IEEE Transactions on Nanotechnology, vol. 16, No. 4, Jul. 2017, pp. 639-652.

Micron, Introducing 2nd Generation Micron Mobile TLC 3D NAND, Industry-Leading Storage Solutions for Flagship Smartphones, (2018), 9 pages.

YMTC, About Xtacking, http://www.ymtc.com, visited Apr. 20, 2020, 3 pages.

International Search Report for Application No. PCT/US2021/033325, dated Sep. 7, 2021, 3 pages.

Written Opinion of the International Searching Authority for Application No. PCT/US2021/033325, 5 pages.

Taiwanese First Office Action for Application No. 110119651, dated Jan. 17, 2022, 16 pages.

* cited by examiner

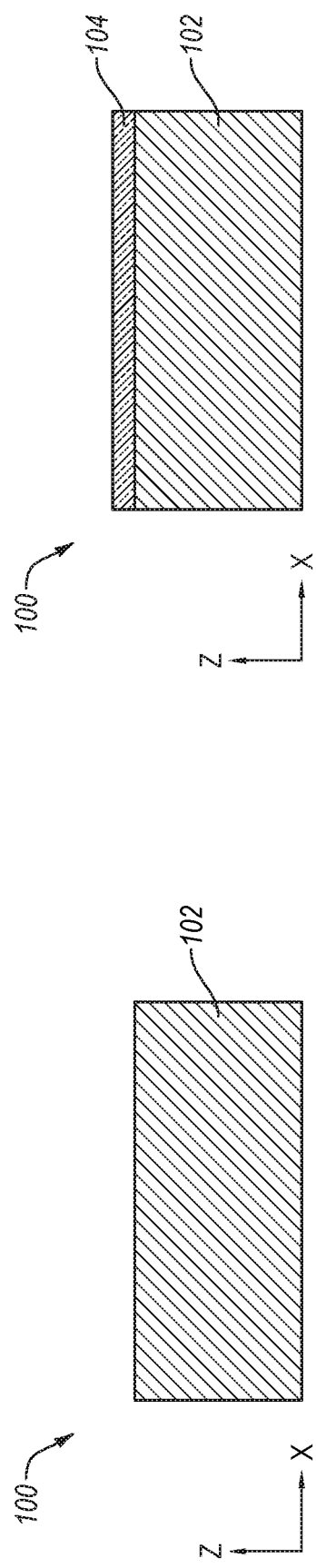
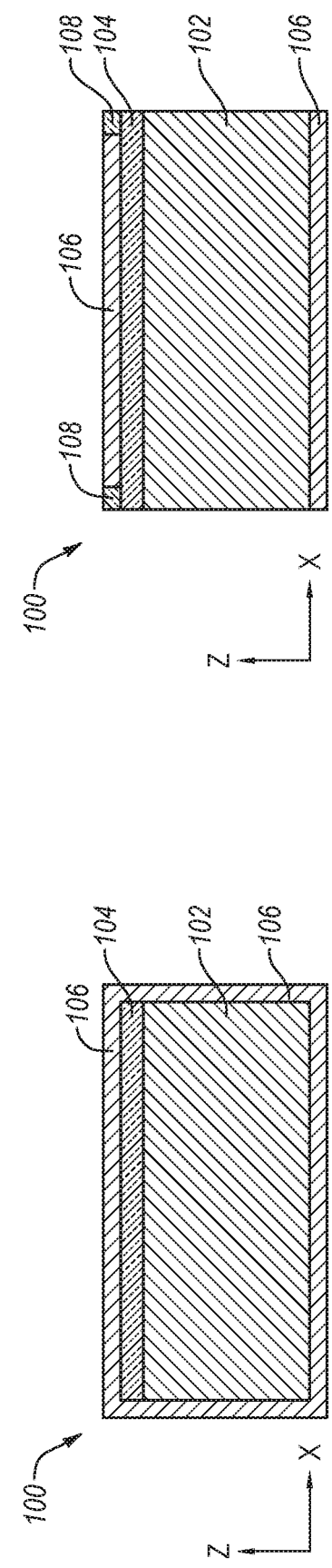
FIG. 1A
FIG. 1B
FIG. 1C
FIG. 1D

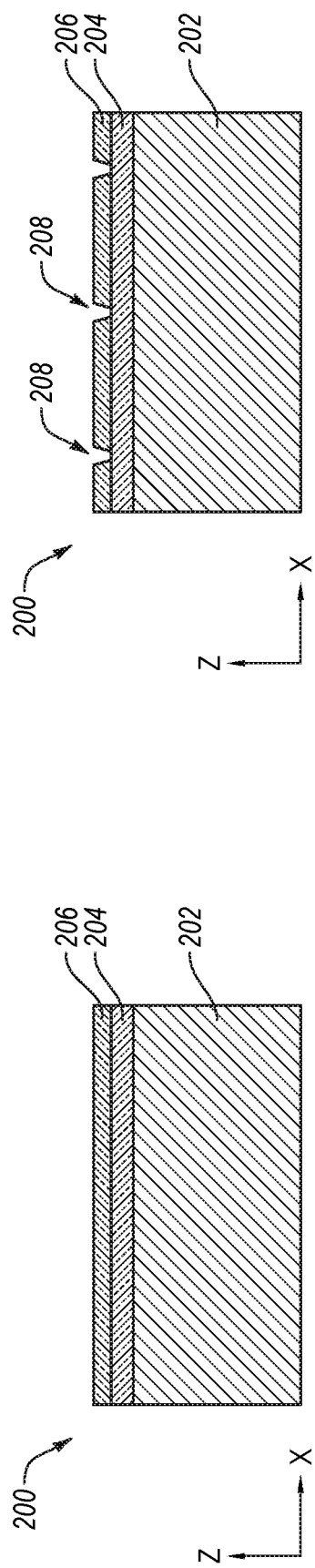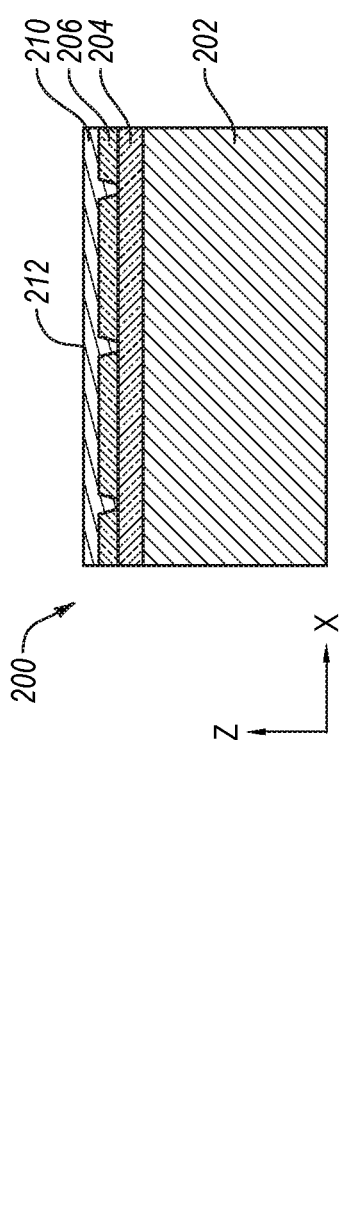

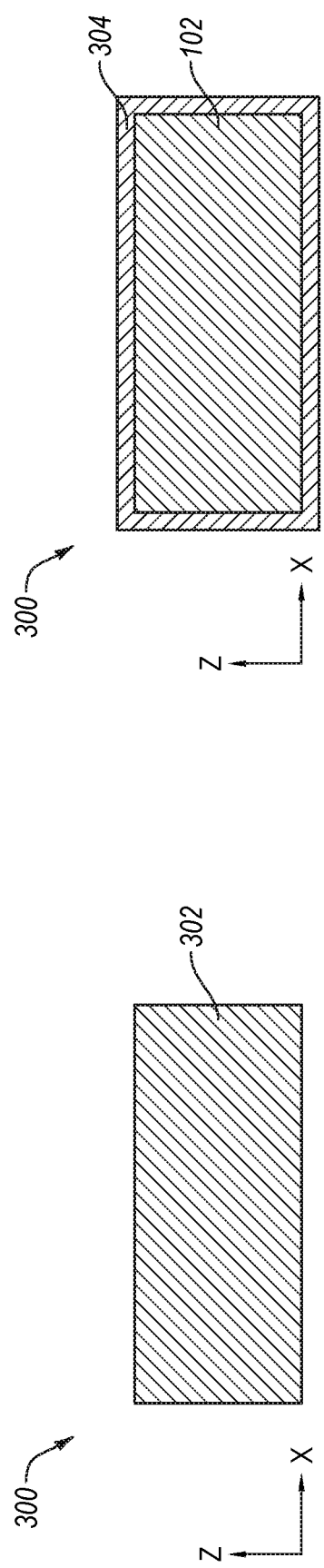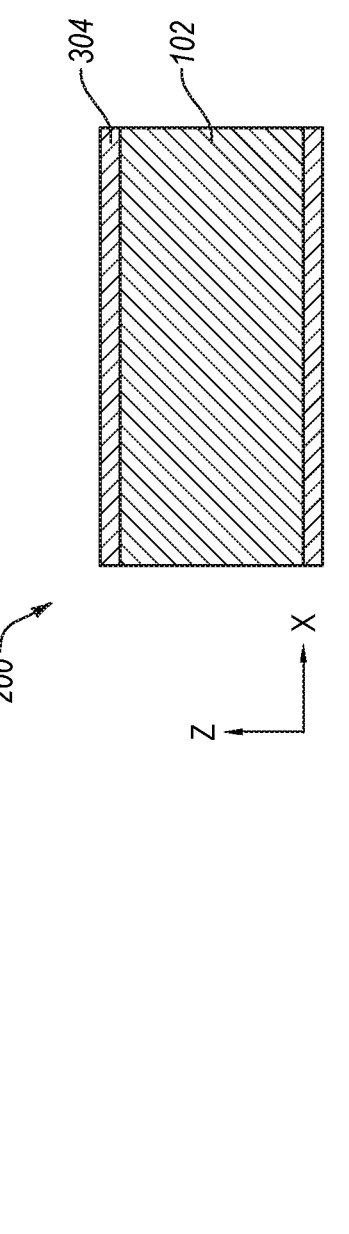

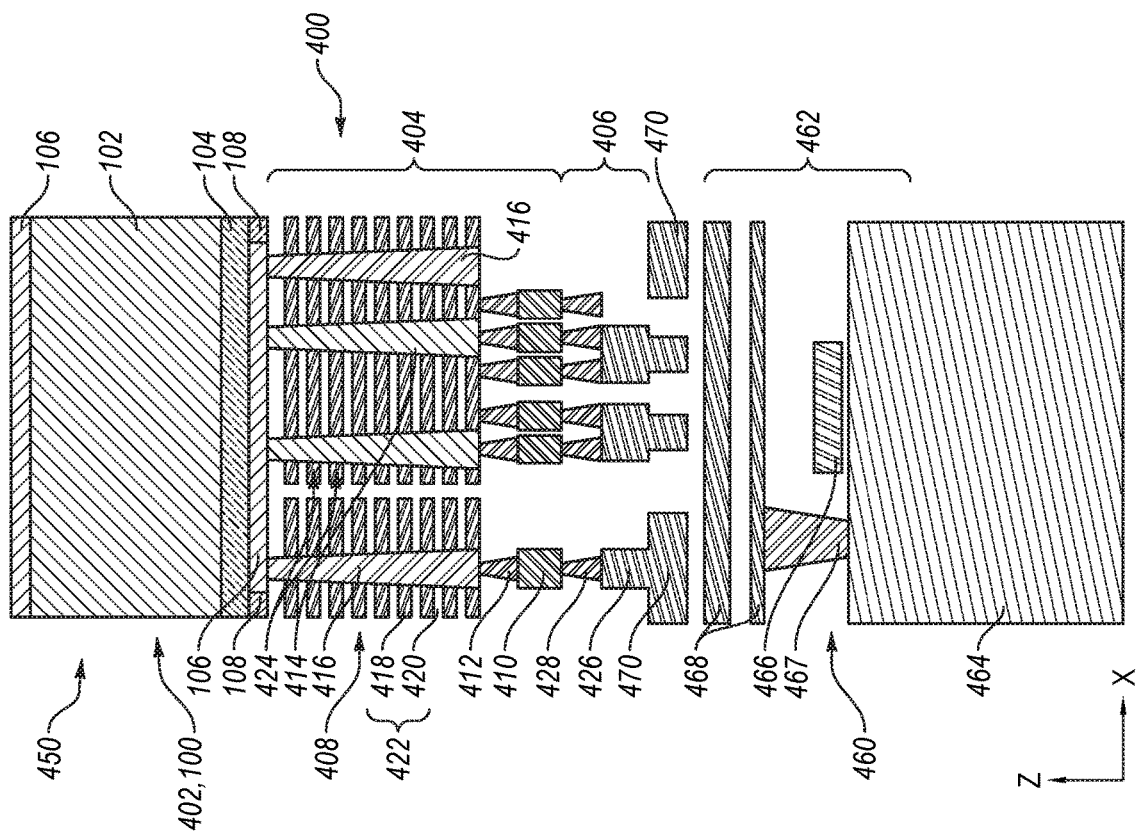
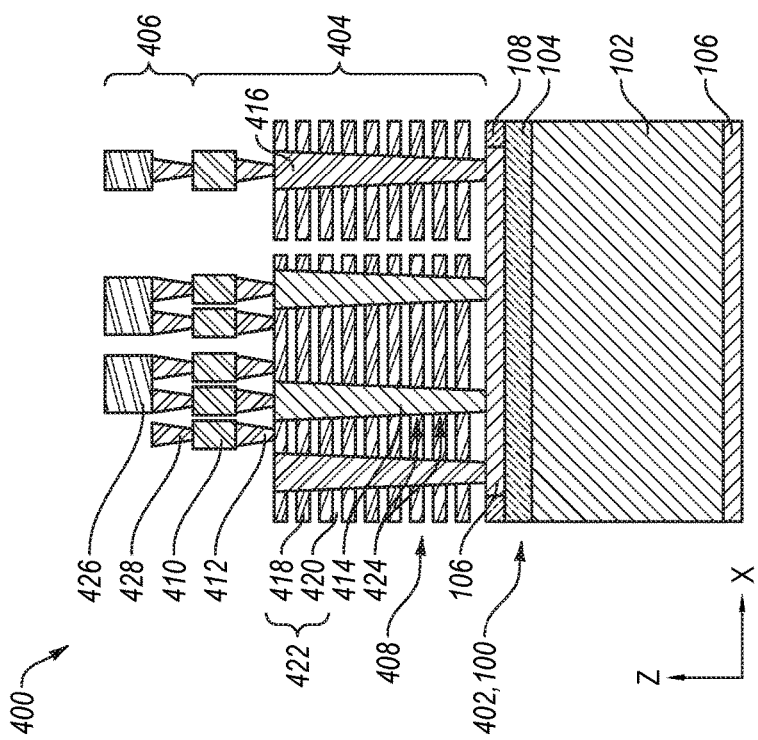
FIG. 4A
FIG. 4B

US 11,380,669 B2

METHODS OF FORMING MICROELECTRONIC DEVICES

CROSS-REFERENCE TO RELATED APPLICATIONS

This application is related to U.S. patent application Ser. No. 16/905,385, filed Jun. 18, 2020, listing Kunal R. Parekh as inventor, for "MICROELECTRONIC DEVICES, AND RELATED METHODS, MEMORY DEVICES, AND ELECTRONIC SYSTEMS." This application is also related to U.S. patent application Ser. No. 16/905,452, filed Jun. 18, 2020, listing Kunal R. Parekh as inventor, for "METHODS OF FORMING MICROELECTRONIC DEVICES, AND RELATED MICROELECTRONIC DEVICES, MEMORY DEVICES, ELECTRONIC SYSTEMS, AND ADDITIONAL METHODS." This application is also related to U.S. patent application Ser. No. 16/905,698, filed Jun. 18, 2020, listing Kunal R. Parekh as inventor, for "METHODS OF FORMING MICROELECTRONIC DEVICES, AND RELATED MICROELECTRONIC DEVICES AND ELECTRONIC SYSTEMS." This application is also related to U.S. patent application Ser. No. 16/905,747, filed Jun. 18, 2020, listing Kunal R. Parekh as inventor, for "METHODS OF FORMING MICROELECTRONIC DEVICES, AND RELATED MICROELECTRONIC DEVICES AND ELECTRONIC SYSTEMS." This application is also related to U.S. patent application Ser. No. 16/905,763, filed Jun. 18, 2020, listing Kunal R. Parekh as inventor, for "METHODS OF FORMING MICROELECTRONIC DEVICES, AND RELATED MICROELECTRONIC DEVICES AND ELECTRONIC SYSTEMS." The disclosure of each of the foregoing documents is hereby incorporated herein in its entirety by this reference.

TECHNICAL FIELD

The disclosure, in various embodiments, relates generally to the field of microelectronic device design and fabrication. More specifically, the disclosure relates to methods of forming base structures for microelectronic devices, methods of forming microelectronic devices, and to related base structures for microelectronic devices.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Control logic devices within a base control logic structure underlying a memory array of a memory device (e.g., a non-volatile memory device) have been used to control operations (e.g., access operations, read operations, write operations) of the memory cells of the memory device. An assembly of the control logic devices may be provided in electrical communication with the memory cells of the memory array by way of routing and interconnect structures. However, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of the memory device, and/or improvements in the performance (e.g., faster memory cell ON/OFF speed, lower threshold switching voltage requirements, faster data transfer rates, lower power consumption) of the memory device. Further, as the density and complexity of the memory army have increased, so has the complexity of the control logic devices. The increased density of the memory array increases the difficulty of forming conductive contacts between components of the memory array and components of the control logic devices.

BRIEF DESCRIPTION OF THE DRAWINGS

FIG. 1A through FIG. 1D are simplified cross-sectional views illustrating a method of forming a base structure, in accordance with embodiments of the disclosure;

FIG. 2A through FIG. 2C are simplified cross-sectional views illustrating a method of forming a base structure, in accordance with other embodiments of the disclosure;

FIG. 3A through FIG. 3C are simplified cross-sectional views illustrating a method of forming a base structure, in accordance with additional embodiments of the disclosure;

FIG. 4A through FIG. 4D are simplified cross-sectional views illustrating a method of forming a microelectronic device structure assembly, in accordance with embodiments of the disclosure;

DETAILED DESCRIPTION

Figure 4D:
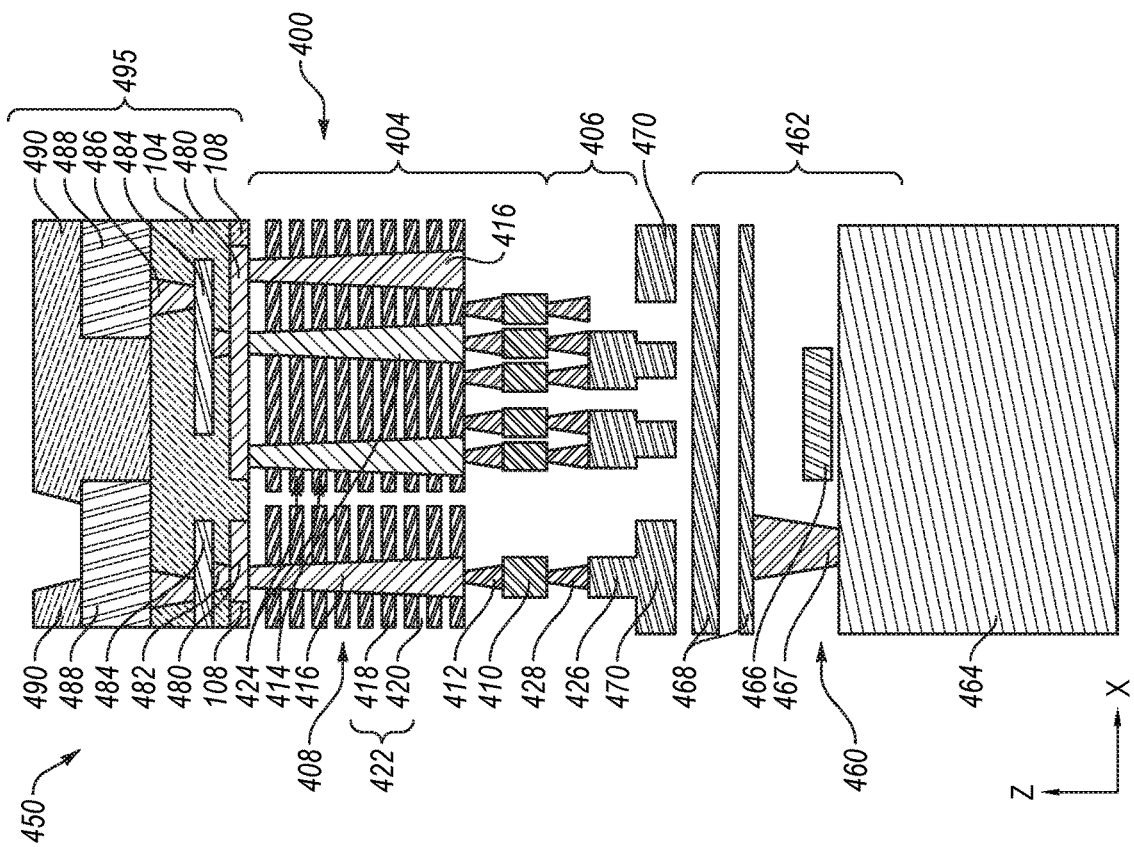

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device, such as NAND Flash memory device), apparatus, or electronic system, or a complete microelectronic device, apparatus, or electronic system. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessary limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a method of forming a microelectronic device comprises forming a first microelectronic device structure and attaching the first microelectronic device structure to a second microelectronic device structure. The first microelectronic device structure includes a base structure on which other components (e.g., a memory array, interconnects) are formed. After attaching the first microelectronic device structure to the second microelectronic device structure, at least a portion of the base structure of the first microelectronic device structure may be removed, such as by grinding, etching, or both. The base structure may include a base material comprising, for example, a semiconductive material (e.g., silicon), a ceramic material, or a glass material. The base structure may be formed to facilitate removal of the base structure from the first microelectronic device structure after attachment of the first microelectronic device structure to the second microelectronic device structure. In some embodiments, the base structure is formed by forming an etch stop material over a surface of the base material, followed by formation of a source material around a periphery of the base structure. The source material may be removed from lateral sides of the base structure to leave at least a portion of the source material over the etch stop material. Lateral sides of the source material over the etch stop material may be removed and replaced with a protective material (e.g., an oxide material). In other embodiments, the base structure comprises a doped material over a surface of the base material and an insulative material over the doped material. Openings may be formed through the insulative material to expose the doped material and an epitaxial material may be grown from the doped material to fill the openings and overlie the insulative material. In yet other embodiments, the base structure comprises a base material comprising a glass material surrounded by a source material. The source material may be removed from lateral sides of the base structure to leave at least a portion of the source material over base material.

After forming the base structure, additional components (e.g., a memory array, interconnects) may be formed over a surface of the base structure to form the first microelectronic device structure. After formation of the first microelectronic device structure, the first microelectronic device structure may be coupled to a second microelectronic device structure to form a microelectronic device structure assembly. The second microelectronic device structure may include a device structure including one or more control logic structures for controlling one or more functions (e.g., operations) of the first microelectronic device structure. After attaching the first microelectronic device structure to the second microelectronic device structure, at least a portion of the base structure (e.g., the base material) may be removed. After removal of the at least a portion of the base structure, a source structure may be formed on the first microelectronic device structure (e.g., from the source material already present on the first microelectronic device structure, or from a source material formed on the microelectronic device structure assembly). Forming the first microelectronic device structure with the base structure may facilitate improved fabrication of the microelectronic device structure assembly including the first microelectronic device structure and the second microelectronic device structure since the base structure may be fabricated to protect other components of the first microelectronic device structure during back side processing of the first microelectronic device structure, such as during removal of the base material. For example, the base structure may be formed to include one or more etch stop materials that may facilitate protection of the other components of the first microelectronic device structure during removal of the base material. In addition, the methods described herein may facilitate formation and/or patterning of the source structure of the first microelectronic device structure after attachment of the first microelectronic device structure to the second microelectronic device structure and removal of the base material.

FIG. 1A through FIG. 1D are simplified partial cross-sectional views illustrating embodiments of a method of forming a base structure prior to further processing to form a first microelectronic device structure (e.g., a memory device, such as a 3D NAND Flash memory device). FIG. 1A through FIG. 1D illustrate a method of forming a base structure 100 of a first microelectronic device structure prior to fabrication of, for example, a memory region on the base structure 100 and prior to bonding of the first microelectronic device structure to a second microelectronic device structure, such as a CMOS substrate.

With the description provided below, it will be readily apparent to one of ordinary skill in the art that the methods and structures described herein with reference to FIG. 1A through FIG. 1D may be used in various devices and electronic systems.

Referring to FIG. 1A, a base structure 100 (e.g., a first die) may comprise a base material 102. The base material 102 (e.g., semiconductive wafer) comprises a material or construction upon which additional materials and structures of the base structure 100 are formed. The base material 102 may comprise one or more of semiconductive material (e.g., one or more of a silicon material, such monocrystalline silicon or polycrystalline silicon (also referred to herein as "polysilicon"); silicon-germanium; germanium; gallium arsenide; a gallium nitride; gallium phosphide; indium phosphide; indium gallium nitride; and aluminum gallium nitride), a base semiconductive material on a supporting structure, glass material (e.g., one or more of borosilicate glass (BSP), phosphosilicate glass (PSG), fluorosilicate glass (FSG), borophosphosilicate glass (BPSG), aluminosilicate glass, an alkaline earth boro-aluminosilicate glass, quartz, titania silicate glass, and soda-lime glass), and ceramic material (e.g., one or more of poly-aluminum nitride (p-AlN), silicon on poly-aluminum nitride (SOPAN), aluminum nitride (AlN), aluminum oxide (e.g., sapphire; $\alpha$-$Al_2O_3$), and silicon carbide).

In some embodiments, the base material 102 comprises a conventional silicon substrate (e.g., a conventional silicon wafer), or another bulk substrate comprising a semiconductive material. As used herein, the term "bulk substrate" means and includes not only silicon substrates, but also silicon-on-insulator (SOI) substrates, such as silicon-on-sapphire (SOS) substrates and silicon-on-glass (SOG) substrates, epitaxial layers of silicon on a base semiconductive foundation, and other substrates formed of and including one or more semiconductive materials.

In other embodiments, the base material 102 comprises a glass wafer. In further embodiments, the base material 102 comprises a ceramic wafer, such as SOPAN wafer. In some such embodiments, the base material 102 may comprise a wafer including silicon and a ceramic material.

A thickness (e.g., in the Z-direction) of the base material 102 may be greater than about 500 micrometers ($\mu$m), greater than about 750 $\mu$m, or even greater than about 1,000 $\mu$m.

With reference to FIG. 1B, an etch stop material 104 may be formed over (e.g., on, directly on) a surface of the base material 102. The etch stop material 104 may include an insulative material exhibiting an etch selectivity with respect to the base material 102. For example, the etch stop material 104 may be formed of and include one or more of silicon dioxide, aluminum oxide, hafnium oxide, niobium oxide, titanium oxide, zirconium oxide, tantalum oxide, magnesium oxide, silicon nitride, an oxynitride material (e.g., silicon oxynitride ($SiO_xN_y$)), and a silicon carboxynitride ($SiO_xC_zN_y$). In some embodiments, the etch stop material 104 comprises an oxide material, such as silicon dioxide. In some embodiments, the etch stop material 104 comprises an oxide of the base material 102. For example, in some embodiments, the base material 102 comprises silicon and the etch stop material 104 comprises silicon dioxide.

The etch stop material 104 may be formed over the surface of the base material 102 by one or more of ALD, CVD, PVD, PECVD, LPCVD, or another deposition method. In other embodiments, the etch stop material 104 is formed (e.g., grown) in situ. By way of non-limiting example, the etch stop material 104 may be formed by thermal oxidation, such as by exposing a surface of the base material 102 to oxygen (e.g., $O_2$, $H_2O$) at a temperature within a range from about 800° C. to about 1,200° C.

Referring to FIG. 1C, after forming the etch stop material 104, a source material 106 may be formed around substantially an entire periphery of the base structure 100. In other words, the source material 106 may overlie and substantially surround the base structure 100. Accordingly, the source material 106 may overlie a major surface of the base material 102, a major surface of the etch stop material 104, and sidewalls of the base material 102 and the etch stop material 104.

The source material 106 may be formed of and include polysilicon. In some embodiments, the source material 106 is doped with one or more dopants, such as, for example, one or more p-type dopants (e.g., boron, aluminum, gallium, indium), one or more n-type dopants (e.g., phosphorus, arsenic, antimony, bismuth, lithium), and/or one or more other dopants (e.g., germanium, silicon, nitrogen).

A thickness (e.g., in the Z-direction) of the source material 106 may be within a range from about 50 nanometers (nm) to about 500 nm, such as from about 50 nm to about 75 nm, from about 75 nm to about 100 nm, from about 100 nm to about 200 nm, from about 200 nm to about 400 nm, or from about 400 nm to about 500 nm.

With reference now to FIG. 1D, after forming the source material 106 around a periphery of the base structure 100, the source material 106 may be removed from lateral sides (e.g., in the X-direction and another direction perpendicular to the X-direction) of the base structure 100. Removal of the source material 106 from lateral sides of the base structure 100 may expose sidewalls of the base material 102 and the etch stop material 104.

The source material 106 may be removed from the lateral sides of the base structure 100 by, for example, exposing the base structure 100 to an edge grinding process (also referred to as an edge profiling process or wafer edge grinding), or another edge treatment method. In other embodiments, the source material 106 is removed by exposing the base structure 100 to an edge trimming process.

After removing the source material 106 from lateral sides of the base structure 100, a protective material 108 may be formed on sides of the source material 106. Accordingly the protective material 108 may surround lateral sides of the source material 106 located over the etch stop material 104.

The protective material 108 may be formed of and include, for example, one or more of the materials described above with reference to the etch stop material 104. In some embodiments, the protective material 108 comprises an oxide material. The protective material 108 may have the same material composition as the etch stop material 104. In other embodiments, the protective material 108 has a different material composition than the etch stop material 104. In some embodiments, the protective material 108 comprises silicon dioxide.

The base structure 100 may be used to facilitate formation of a first microelectronic device structure of a microelectronic device (e.g., a semiconductor device; a memory device, such as a 3D NAND Flash memory device). After forming the first microelectronic device structure from the base structure 100, the first microelectronic device structure may be coupled to one or more other microelectronic device structures, such as a chiplet including one or more control logic regions, as will be described herein.

FIG. 2A through FIG. 2C are simplified partial cross-sectional views illustrating embodiments of a method of forming a base structure 200 prior to further processing to form a first microelectronic device structure of a microelectronic device (e.g., a semiconductor device; a memory device, such as a 3D NAND Flash memory device), in accordance with additional embodiments of the disclosure. FIG. 2A through FIG. 2C illustrate a method of forming a base structure 200 prior to fabrication of, for example, a memory array on the base structure 200 to form the first microelectronic device structure and prior to bonding the first microelectronic device structure to a second microelectronic device structure.

With reference to FIG. 2A, the base structure 200 may include a base material 202. The base material 202 comprises a base material or construction upon which additional materials and structures of the microelectronic device structure 200 are formed. The base material 202 may include one or more of the materials described above with reference to the base material 202 (FIG. 1A). For example, the base material 202 may comprise one or more of semiconductive material (e.g., one or more of a silicon material, such monocrystalline silicon or polycrystalline silicon; silicon-germanium; germanium; gallium arsenide; a gallium nitride; gallium phosphide; indium phosphide; indium gallium nitride; and aluminum gallium nitride) a base semiconductive material on a supporting structure, glass material (e.g., one or more of BSP, PSG, FSG, BPSG, al aluminosilicate glass, an alkaline earth boro-aluminosilicate glass, quartz, titania silicate glass, and soda-lime glass), and a ceramic material (e.g., one or more of p-AlN, SOPAN, AlN, aluminum oxide (e.g., sapphire; $\alpha$-$Al_2O_3$), and silicon carbide).

In some embodiments, the base material 202 comprises a conventional silicon substrate (e.g., a conventional silicon wafer), or another bulk substrate comprising a semiconductive material. In some embodiments, the base material 202 comprises a material that may be doped with one or more dopants.

A thickness (e.g., in the Z-direction) of the base material 202 may be the same as that described above with reference to the base material 102.

With continued reference to FIG. 2A, a doped material 204 may overlie the base material 202. The doped material 204 may include one or more dopants, such as one or more p-type dopants (e.g., boron, aluminum, gallium, indium), one or more n-type dopants (e.g., phosphorus, arsenic, antimony, bismuth, lithium), and/or one or more other dopants (e.g., germanium, silicon, nitrogen). In some embodiments, the doped material 204 comprises the same material composition as the base material 202, except that the doped material 204 is doped with the one or more dopants.

The dopants may be present in the doped material 204 at a concentration within a range from about $1\times10^{19}$ atoms/$cm^3$ (or more simply, $1\times10^{19}$/$cm^3$) to about $4.0\times10^{20}$/$cm^3$, such as from about $1\times10^{19}$/$cm^3$ to about $5\times10^{19}$/$cm^3$, from about $5\times10^{19}$/$cm^3$ to about $1\times10^{20}$/$cm^3$, from about $1\times10^{20}$/$cm^3$ to about $2.0\times10^{20}$/$cm^3$, or from about $2.0\times10^{20}$/$cm^3$ to about $4.0\times10^{20}$/$cm^3$.

In some embodiments, the doped material 204 comprises one or more of boron, germanium, and phosphorus. By way of non-limiting example, the doped material 204 may include silicon doped with boron; silicon doped with boron and germanium; silicon doped with phosphorus; or silicon doped with gallium. In some embodiments, the doped material 204 comprises so-called heavily boron-doped silicon.

As will be described herein, the doped material 204 may facilitate selective etching of the base material 202 relative to the doped material 204 during further processing of the base structure 200. Accordingly, the doped material 204 may function as an etch stop material during removal of the base material 202.

An insulative material 206 may overlie the doped material 204. The doped material 204 may be located between the insulative material 206 and the base material 202. The insulative material 206 may comprise one or more of the materials described above with reference to the etch stop material 104 (FIG. 1B). For example, the insulative material 206 may be formed of and include one or more of silicon dioxide, aluminum oxide, hafnium oxide, niobium oxide, titanium oxide, zirconium oxide, tantalum oxide, magnesium oxide, silicon nitride, an oxynitride material (e.g., silicon oxynitride ($SiO_xN_y$)), and a silicon carboxynitride ($SiO_xC_zN_y$). In some embodiments, the insulative material 206 comprises silicon dioxide.

Referring to FIG. 2B, the insulative material 206 may be patterned to form openings 208 therein and to expose a portion of the doped material 204 through the openings 208. The openings 208 through the insulative material 206 may be formed by, for example, exposing the insulative material 206 to an etchant through a mask. The insulative material 206 may be exposed to a dry etchant comprising one or more of a fluorocarbon (e.g., $CH_2F_2$, $CH_3F$, $CF_4$, $C_4F_8$, $C_4F_6$, $CF_2$), $SF_6$, $NF_3$, and oxygen. However, the disclosure is not so limited and the openings 208 through the insulative material 206 may be formed by methods other than those described.

With reference to FIG. 2C, after forming the openings 208 (FIG. 2B) and exposing the doped material 204 through the openings 208, a semiconductive material 210 may be formed over the exposed portions of the doped material 204, within the openings 208, and over the remaining portions of the insulative material 206.

In some embodiments, the semiconductive material 210 is formed by epitaxial growth. By way of non-limiting example, the semiconductive material 210 may be grown from the exposed portions of the doped material 204. The semiconductive material 210 may comprise a monocrystalline material and may include a monocrystalline surface 212. In some embodiments, the semiconductive material 210 exhibits the same crystalline orientation as the doped material 204. The monocrystalline surface 212 may facilitate formation of one or more device structures on the monocrystalline surface 212, as will be described herein.

The semiconductive material 210 may be formed of and include one or more of the materials described above with referenced to the doped material 204. In some embodiments, the semiconductive material 210 comprises the same material composition as the doped material 204, except that a concentration of the dopants in the semiconductive material 210 is less than the concentration of the dopants in the doped material 204. In some embodiments, the semiconductive material 210 comprises doped epitaxial silicon (e.g., epitaxial silicon doped with one or more of at least one n-type dopant, at least one p-type dopant, or at least another dopant).

The base structure 200 may be used to facilitate formation of a first microelectronic device structure (e.g., a semiconductor device, a memory device (e.g., NAND Flash memory device)). After forming the first microelectronic device from the base structure 200, the first microelectronic device may be coupled to one or more other microelectronic device structures, such as a chiplet including one or more control logic regions, as will be described herein.

FIG. 3A through FIG. 3C are simplified partial cross-sectional views illustrating embodiments of another method of forming a base structure 300, in accordance with embodiments of the disclosure. FIG. 3A through FIG. 3C illustrate a method of forming a base structure 300 prior to fabrication of, for example, a memory region on the base structure 300 to form the first microelectronic device structure and prior to bonding the first microelectronic device structure to a second microelectronic device structure.

With reference to FIG. 3A, the base structure 300 may include a base material 302. The base material 302 may include one or more of the materials described above with reference to the base material 102 (FIG. 1A). In some embodiments, the base material 302 comprises a glass material, such as one or more of borosilicate glass (BSP), aluminosilicate glass, an alkaline earth boro-aluminosilicate glass, phosphosilicate glass (PSG), borophosphosilicate glass (BPSG), quartz, titania silicate glass, soda-lime glass.

Referring to FIG. 3B, a source material 304 may be formed around substantially an entire periphery of the base material 302. The source material 304 may be formed of and include one or more of the materials described above with reference to the source material 106 (FIG. 1C). In some embodiments, the source material 304 comprises polysilicon. In some such embodiments, the source material 304 may comprise doped polysilicon. The source material 304 may have a same thickness as the source material 106 described above.

Referring to FIG. 3C, after forming the source material 304, portions of the source material 304 on lateral sides of the base material 302 may be removed, such as by exposing the base structure 300 to an edge grinding process, an edge trimming process, or another edge treatment process, as described above with reference to FIG. 1D.

After forming the source material 304, the base structure 300 may be used to facilitate formation of a microelectronic device (e.g., a semiconductor device; a memory device, such as a 3D NAND Flash memory device). After forming the first microelectronic device from the base structure 300, the microelectronic device may be coupled to one or more other microelectronic device structures, such as a chiplet including one or more control logic regions, as will be described herein.

As described above, after forming the base structures 100, 200, 300, first microelectronic device structures may be formed on, over, or within the base structures 100, 200, 300. The first microelectronic device structures may comprise, for example, features (e.g., structures, materials, devices) of a semiconductor device, a memory device (e.g., 3D NAND Flash memory device), or another device. FIG. 4A is a simplified cross-sectional view of a first microelectronic device structure 400, in accordance with embodiments of the disclosure. The first microelectronic device structure 400 may also be referred to as an array wafer. The first microelectronic device structure 400 may include an array wafer substrate 402, which may be substantially similar to the base structure 100 described above with reference to FIG. 1D. In other words, the array wafer substrate 402 may include the base material 102, the etch stop material 104, the source material 106, and the protective material 108. Although the array wafer substrate 402 is illustrated as comprising the base structure 100, it will be understood that the array wafer substrate 402 may be may correspond to any of the base structures 100, 200, 300 described above with reference to FIG. 1A through FIG. 3C.

The first microelectronic device structure 400 may be formed to include a memory array region 404 vertically over (e.g., in the Z-direction) the array wafer substrate 402 and an interconnect region 406 vertically over the memory array region 404. The memory array region 404 may be vertically interposed between the interconnect region 406 and the array wafer substrate 402.

The memory array region 404 may include a stack structure 408, line structures 410 (e.g., digit line structures, bit line structures), and line contact structures 412. The line contact structures 412 may vertically overlie (e.g., in the Z-direction) the stack structure 408, and may be electrically connected to structures, such as cell pillar structures 414 and deep contact structures 416 extending through the stack structure 408.

The stack structure 408 may include a vertically alternating (e.g., in the Z-direction) sequence of conductive structures 418 and insulative structures 420 arranged in tiers 422. Each of the tiers 422 of the stack structure 408 may include at least one of the conductive structures 418 vertically neighboring at least one of the insulative structures 420. In some embodiments, the conductive structures 418 are formed of and include tungsten and the insulative structures 420 are formed of and include silicon dioxide. The conductive structures 418 and insulative structures 420 of the tiers 422 of the stack structure 408 may each individually be substantially planar, and may each individually exhibit a desired thickness.

The cell pillar structures 414 may each individually include a semiconductive pillar (e.g., a polysilicon pillar, a silicon-germanium pillar) at least partially surrounded by one or more charge storage structures (e.g., a charge trapping structure, such as a charge trapping structure comprising an oxide-nitride-oxide ("ONO") material; floating gate structures). Intersections of the cell pillar structures 414 and the conductive structures 418 of the tiers 422 of the stack structure 408 may define vertically extending strings of memory cells 424 coupled in series with one another within the memory array region 404 of the first microelectronic device structure 400. In some embodiments, the memory cells 424 formed at the intersections of the conductive structures 418 and the cell pillar structures 414 within each the tiers 422 of the stack structure 408 comprise so-called "MONOS" (metal-oxide-nitride-oxide-semiconductor) memory cells. In additional embodiments, the memory cells 424 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 424 comprise so-called "floating gate" memory cells including floating gates (e.g., metallic floating gates) as charge storage structures. The floating gates may horizontally intervene between central structures of the cell pillar structures and the conductive structures 418 of the different tiers 422 of the stack structure 408.

The cell pillar structures 414 may vertically extend from an upper vertical boundary of the stack structure 408, through the stack structure 408, and to a location at or proximate an upper vertical boundary of the base structure 100 (e.g., within a dielectric material on the base structure 100).

The deep contact structure(s) 416 may be configured and positioned to electrically connect one or more components of the first microelectronic device structure 400 vertically overlying the stack structure 408 with one or more components of the first microelectronic device structure 400 vertically underlying the stack structure 408. The deep contact structure(s) 416 may be formed of and include conductive material.

With continued reference to FIG. 4A, the interconnect region 406 comprises first bond pad structures 426 electrically coupled to the line structures 410 by first interconnect structures 428. The first interconnect structures 428 may vertically overlie (e.g., in the Z-direction) and be electrically connected to the line structures 410 and the first bond pad structures 426 may vertically overlie (e.g., in the Z-direction) and be electrically connected to the first interconnect structures 428. The first bond pad structures 426 and the first interconnect structures 428 may individually be formed of and include conductive material. In some embodiments, the first bond pad structures 426 are formed of and include copper and the first interconnect structures 428 are formed of and include tungsten.

Referring to FIG. 4B, after forming the memory array region 404 and the interconnect region 406, the first microelectronic device structure 400 may be flipped upside down (e.g., in the Z-direction) and attached (e.g., bonded) to a second microelectronic device structure 460 to form a microelectronic device structure assembly 450 comprising the first microelectronic device structure 400 and the second microelectronic device structure 460. The first bond pad structures 426 of the interconnect region 406 of the first microelectronic device structure 400 may be coupled to second bond pad structures 470 of the second microelectronic device structure 460. For example, after flipping the first microelectronic device structure 400, the first bond pad structures 426 may be horizontally aligned and brought into physical contact with the second bond pad structures 470 of the second microelectronic device structure 460. At least one thermocompression process may be employed to migrate (e.g., diffuse) and interact material(s) (e.g., copper) of the first bond pad structures 426 and the second bond pad structures 470 with one another to bond the first microelectronic device structure 400 to the second microelectronic device structure 460 to form the microelectronic device structure assembly 450.

The second microelectronic device structure 460 may include a control logic region 462. The control logic region 462 may include a semiconductive base structure 464, gate structures 466, and routing structures 468. Portions of the semiconductive base structure 464, gate structures 466, and routing structures 468 form various control logic devices of the control logic region 462. The control logic devices may be configured to control various operations of other components (e.g., memory cells 424 of the cell pillar structures 414), such as components of the first microelectronic device structure 400. The control logic devices may include devices configured to control read, write, and/or erase operations of the memory cells 424 of the memory cell pillar structures 414 of the memory array region 404. As a non-limiting example, the control logic devices may include one or more (e.g., each) of charge pumps (e.g., $V_{CCP}$ charge pumps, $V_{NEGWL}$ charge pumps, DVC2 charge pumps), DLL circuitry (e.g., ring oscillators), $V_{dd}$ regulators, string drivers, page buffers, and various chip/deck control circuitry. As another non-limiting example, As another non-limiting example, the control logic devices may include devices to control column operations of arrays (e.g., memory element array(s), access device array(s)) within the memory array region 404, such as one or more (e.g., each) of decoders (e.g., local deck decoders, column decoders), sense amplifiers (e.g., EQ amplifiers, ISO amplifiers, NSAs, PSAs), repair circuitry (e.g., column repair circuitry), I/O devices (e.g., local I/O devices), memory test devices, MUX, and ECC devices. As a further non-limiting example, the control logic devices of the control logic region 462 may include devices configured to control row operations for arrays (e.g., memory element array(s), access device array(s)) within the memory array region 404, such as one or more (e.g., each) of decoders (e.g., local deck decoders, row decoders), drivers (e.g., WL drivers), repair circuitry (e.g., row repair circuitry), memory test devices, MUX, ECC devices, and self-refresh/wear leveling devices. However, the disclosure is not so limited and the control logic devices of the control logic region 462 may include other and/or additional components.

The semiconductive base structure 464 may comprise a base material or construction upon which additional materials are formed. The semiconductive base structure 464 may comprise a semiconductive structure (e.g., a semiconductive wafer), or a base semiconductive material on a supporting structure. For example, the semiconductive base structure 464 may comprise a conventional silicon substrate (e.g., a conventional silicon wafer), or another bulk substrate comprising a semiconductive material. In addition, the semiconductive base structure 464 may include one or more layers, structures, and/or regions formed therein and/or thereon. For example, the semiconductive base structure 464 may include conductively doped regions and undoped regions. The conductively doped regions may, for example, be employed as source regions and drain regions for transistors of the control logic devices of the control logic region 462; and the undoped regions may, for example, be employed as channel regions for the transistors of the control logic devices.

The gate structures 466 of the control logic region 462 may vertically overlie (e.g., in the Z-direction) portions of the semiconductive base structure 464. The gate structures 466 may individually horizontally extend between and be employed by transistors of the control logic devices within the control logic region 462 of the second microelectronic device structure 460. The gate structures 466 may be formed of and include a conductive material. A gate dielectric material (e.g., a dielectric oxide) may vertically intervene (e.g., in the Z-direction) between the gate structures 466 and channel regions (e.g., within the semiconductive base structure 464) of the transistors. For clarity and ease of understanding of the description, the gate dielectric material is not illustrated in FIG. 4B.

The routing structures 468 may vertically overlie (e.g., in the Z-direction) the semiconductive base structure 464 and may be electrically connected to the semiconductive base structure 464 by way of interconnect structures 467. Some of the interconnect structures 467 may vertically extend between and electrically couple some of the routing structures 468, and other of the interconnect structures 467 may vertically extend between and electrically couple regions (e.g., conductivity doped regions, such as source regions and drain regions) of the semiconductive base structure 464 to one or more of the routing structures 468. The routing structures 468 and the interconnect structures 467 may each individually be formed of and include conductive material.

The second bond pad structures 470 vertically overlie (e.g., in the Z-direction) and electrically connect with the routing structures 468 by one or more interconnect structures. The second bond pad structures 470 may be formed of and include conductive material. As described above, the second bond pad structures 470 may be coupled to the first bond pad structures 426 of the first microelectronic device structure 400 to form the microelectronic device structure assembly 450.

Figure 4C:
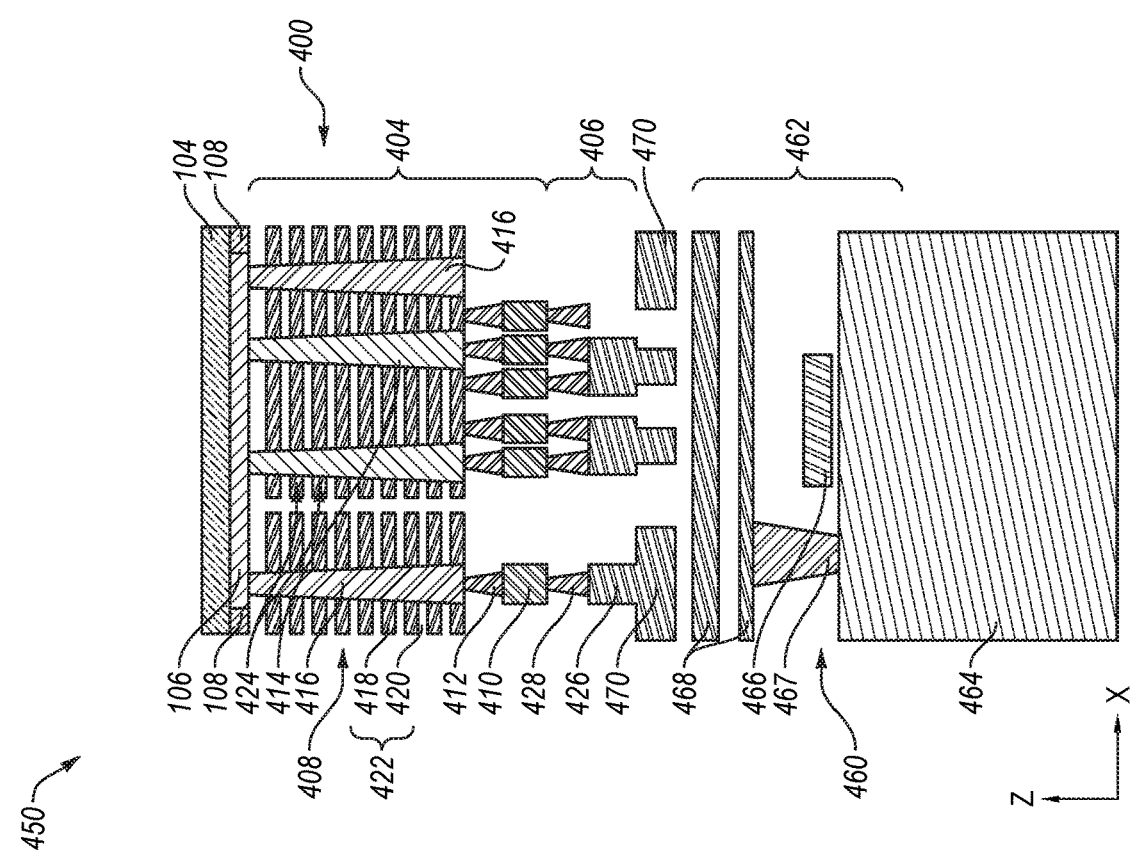

Referring to FIG. 4C, after forming the microelectronic device structure assembly 450, portions of the source material 106 on the back side of the base material 102, and the base material 102 may be removed (e.g., detached) from the first microelectronic device structure 400. The source material 106 and the base material 102 may be removed by one or more material removal processes such as one or both of grinding and etching. For example, the base material 102 may be removed by grinding the source material 106 and the base material 102. The base material 102 may be removed by grinding until a thickness of the base material 102 is less than about 100 µm, such as less than about 75 µm, less than about 50 µm, or less than about 40 µm.

After grinding the base material 102, remaining portions of the base material 102 may be removed by etching (e.g., wet etching, dry etching) with an etching process selective to the etch stop material 104. As one example, the base material 102, may be exposed to a wet etchant comprising one or both of potassium hydroxide (KOH) and tetramethylammonium hydroxide (TMAH) to selectively remove the base material 102 without substantially removing the etch stop material 104. In other embodiments, the base material 102 is exposed to a dry etching process (e.g., reactive ion etching (ME), inductively coupled plasma (ICP) etching) to selectively remove the base material 102 without substantially removing the etch stop material 104. In some embodiments, the dry etchant includes one or more of sulfur hexafluoride ($SF_6$), oxygen ($O_2$), $C_4F_8$, $CF_4$, $C_3F_6$, xenon difluoride ($XeF_2$), or another material.

In some embodiments, the presence of the protective material 108 around lateral sides of the source material 106 adjacent to the memory array region 404 may protect the source material 106 during removal of the base material 102. In some embodiments, the protective material 108 may reduce or substantially prevent contamination of the source material 106 with contaminants and particulates generated grinding of the source material 106 and may also prevent undesired exposure of the source material 106 to one or more etchants.

With reference to FIG. 4D, after removing the base material 102 (FIG. 4B), a back end of the line (BEOL) structure 495 may be formed over the etch stop material 104 and in electrical communication with source structures 480 formed from the source material 106 (FIG. 4C). For example, openings may be formed through the etch stop material 104 and the source material 106 to separate portions of the source material 106 from each other and form the source structures 480. The openings may be filled with an insulative material to isolate different portions of the source structure 480 from each other. The insulative material may include the same material composition as the etch stop material 104. In some embodiments, a conductive material, such as tungsten silicide ($WSi_x$), tungsten nitride, tungsten silicon nitride ($WSi_xN_y$) may be formed over the source material 106 prior to patterning the source material 106 to form the source structures 480. In some embodiments, the etch stop material 104 may be removed from surfaces of the source material 106 prior to forming the conductive material over the source material 106. In some embodiments, the source structure 480 comprises one or more of doped silicon (e.g., doped polysilicon), tungsten silicide, tungsten nitride, and tungsten silicon nitride.

The insulative material may isolate portions of the source structure 480 in electrical communication with the memory cell pillar structures 414 from other portions of the source structure 480 in electrical communication with other portions of the memory array region 404 (e.g., the deep contact structures 416). Since the first microelectronic device structure 400 is formed to include the source material 106, the source structures 480 may be formed without deposition of a source material after attachment of the first microelectronic device structure 400 to the second microelectronic device structure 460. In addition, the source structures 480 may be formed without deposition of a source material after removal of the base material 102 (FIG. 4B).

The BEOL structure 495 may include second interconnect structures 482 in electrical communication with the source structures 480 and electrically coupling the source structures 480 to first metallization structures 484. The second interconnect structures 482 may be formed of and include conductive material, such as tungsten. The first metallization structures 484 may be formed of and include conductive material, such as copper.

Third interconnect structures 486 may electrically couple the first metallization structures 484 to second metallization structures 488. A passivation material 490 may be formed over the microelectronic device structure assembly 450 to electrically isolate the second metallization structures 488. The third interconnect structures 486 and the second metallization structures 488 may be formed of and include conductive material. For example, the third interconnect structures 486 may be formed of and include tungsten. The second metallization structures 488 may be formed of and include aluminum.

Although FIG. 4A through FIG. 4D have been described and illustrated as including the first microelectronic device structure 400 comprising the array wafer substrate 402 comprising the base structure 100, the disclosure is not so limited. In other embodiments, the array wafer substrate 402 comprises the base structure 300 (FIG. 3C). In some embodiments, during removal of the base material 302 (FIG. 3C) from the microelectronic device structure assembly 450, the base material 302 may be removed by, for example, exposing the base material 302 to hydrofluoric acid or a grinding process.

Figure 5A:
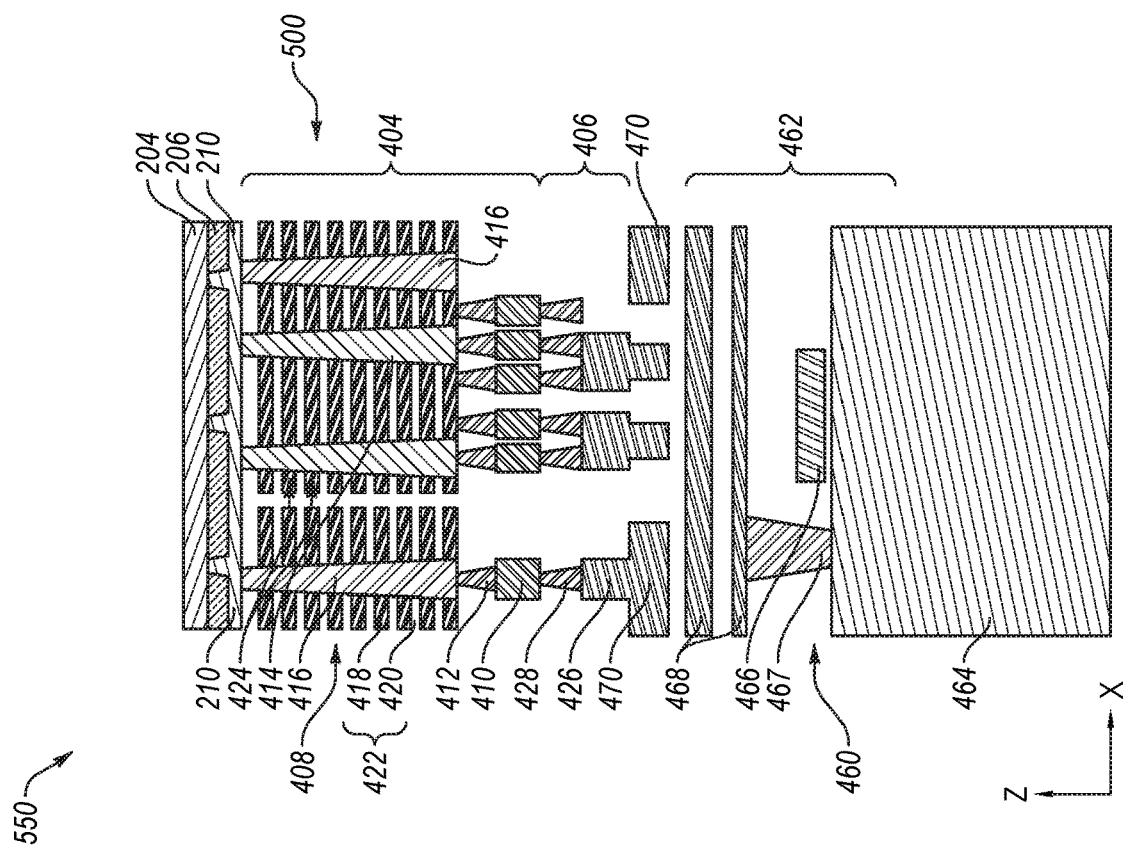
FIG. 5A through FIG. 5C are simplified cross-sectional views illustrating a method of forming a microelectronic device structure assembly, in accordance with other embodiments of the disclosure.

In other embodiments, the first microelectronic device structure may be formed with the base structure 200 described above with reference to FIG. 2C. FIG. 5A is a simplified cross-sectional view illustrating a microelectronic device structure assembly 550 including a first microelectronic device structure 500, in accordance with embodiments of the disclosure. The microelectronic device structure assembly 550 is substantially similar to the microelectronic device structure assembly 450 described above with reference to FIG. 4B, except that the first microelectronic device structure 500 includes the base structure 200 described above with reference to FIG. 2C. Accordingly, the first microelectronic device structure 500 may include an array wafer substrate comprising the base structure 200. As described above with reference to FIG. 4A, the memory array region 404 and the interconnect region 406 may be formed above the array wafer substrate. Thereafter, the first bond pad structures 426 may be bonded to the second bond pad structures 470 of the second microelectronic device structure 460 to form the microelectronic device structure assembly 550.

In some embodiments, the memory array region 404 may be formed over the monocrystalline surface 212 (FIG. 2C) which may facilitate improved fabrication of the memory array region 404. For example, etching and patterning of the memory cell pillar structures 414 may be improved by forming the memory cell pillar structures 414 over the monocrystalline surface 212 compared to conventional microeconomic device structures wherein memory cell pillars are formed polysilicon. In addition, use of the base structure 200 may facilitate transfer and attachment of the first microelectronic device structure 400 to the second microelectronic device structure 460 since the base material 202 may exhibit a greater stiffness than conventional base materials.

Figure 5B:
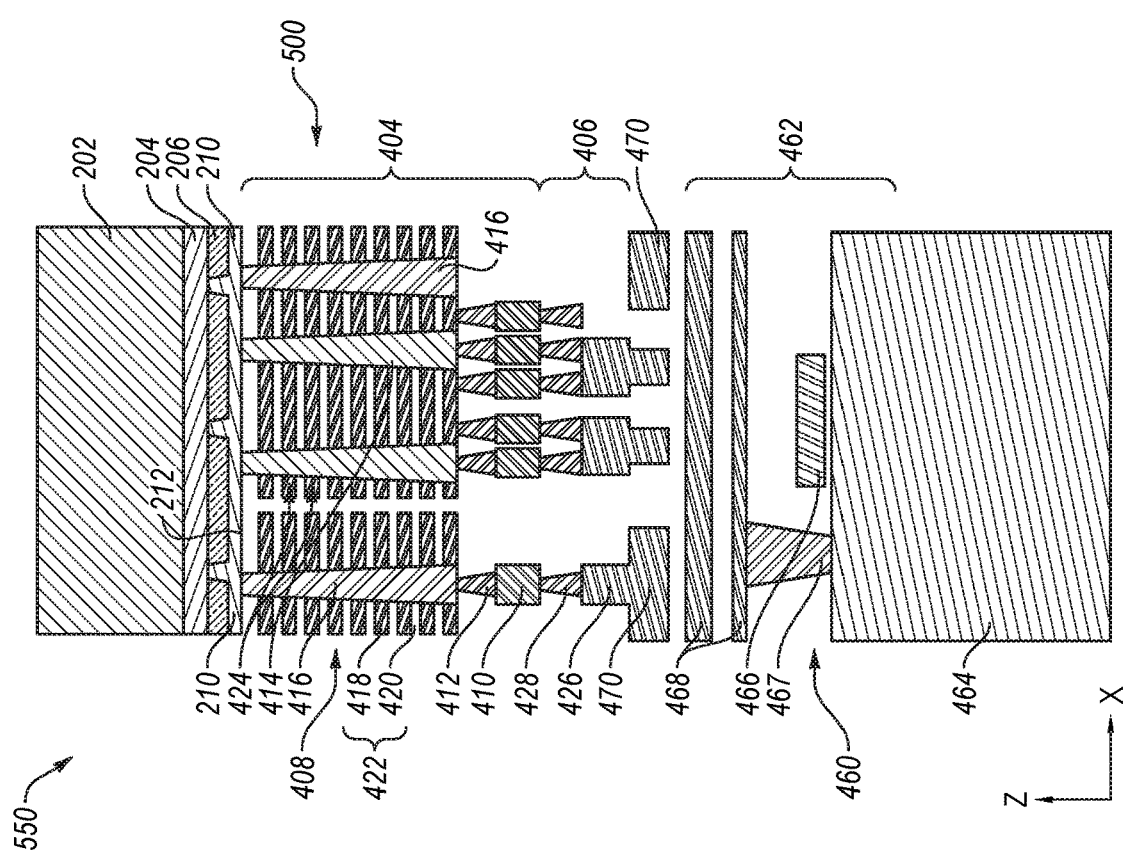

With reference to FIG. 5B, after forming the microelectronic device structure assembly 550, at least a portion of the base material 202 of the first microelectronic device structure 500 may be removed from the microelectronic device structure assembly 550. For example, the base material 202 may be removed by grinding the base material 202 to a thickness less than about 100 µm, such as less than about 75 µm, less than about 50 µm, or less than about 40 µm.

After grinding the base material 202, the remaining portions of the base material 202 may be removed by one or more material removal processes that selectively remove the base material 202 relative to the doped material 204. In other words, the doped material 204 may be used as an etch stop material during removal of the base material 202. By way of non-limiting example, base material 202 may be exposed to a wet etchant including one or both of KOH and TMAH to remove the remaining portions of the base material 202 without substantially removing the doped material 204. In some embodiments, the wet etchant comprises TMAH. Removal of the remaining portions of the base material 202 may expose surfaces of the doped material 204.

Figure 5C:
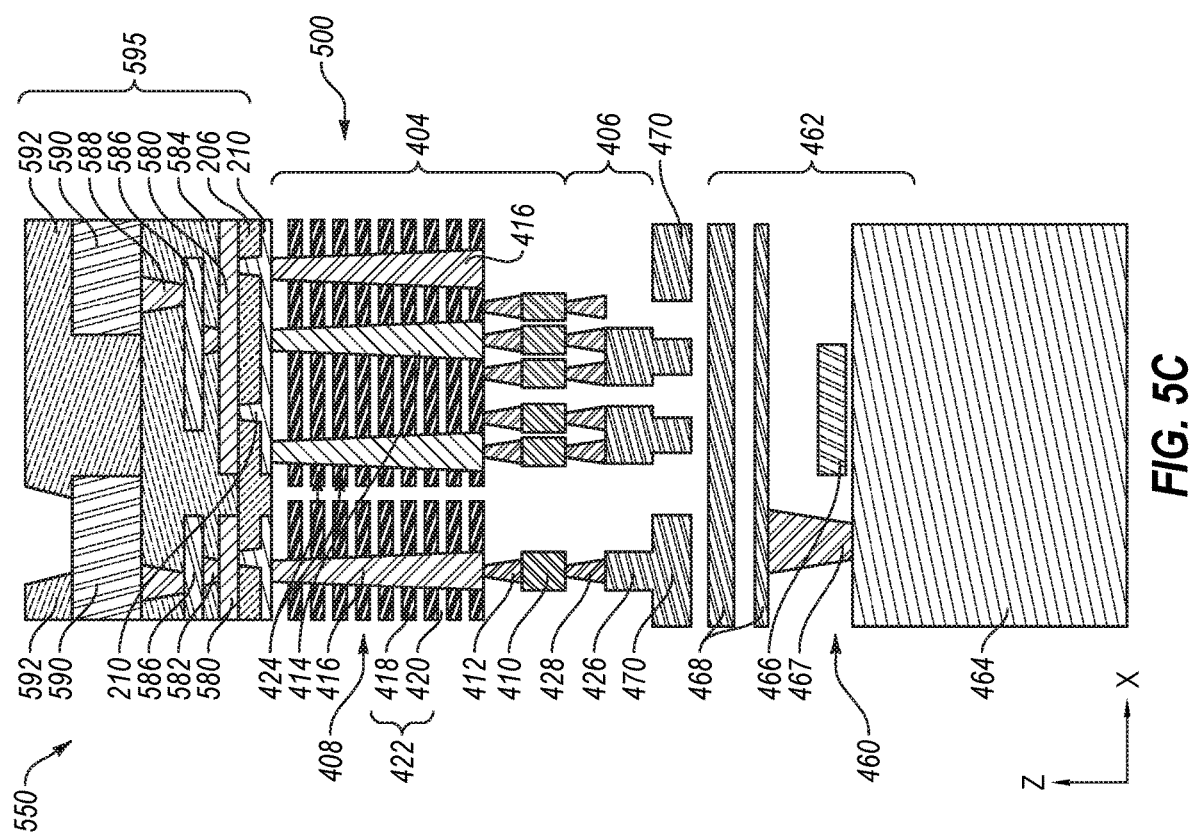

With reference to FIG. 5C, the doped material 204 may be selectively removed relative to the insulative material 206. By way of non-limiting example, the doped material 204 may be removed with an etchant comprising nitric acid and hydrofluoric acid. The ratio of the hydrofluoric acid to the nitric acid, the concentration of the hydrofluoric acid and nitric acid, and the temperature of the etch solution may be controlled to facilitate a desired rate of removal of the doped material 204. However, the disclosure is not so limited and the doped material 204 may be selectively removed relative to the insulative material 206 by other methods.

After removing the doped material 204, a source structure 580 may be formed over the insulative material 206 and in electrical communication with the semiconductive material 210 formed through the insulative material 206. The source structure 580 may be substantially similar to the source structure 480 described above. The source structure 580 may be formed of and include one or more of doped silicon (e.g., doped polysilicon), tungsten silicide, tungsten nitride, and tungsten silicon nitride.

In additional embodiments, the source structure 580 is formed from the doped material 204. As a non-limiting example, at least partially depending on the material composition of the doped material 204, portions of the doped material 204 may be removed (e.g., etched) relative to other portions of the source structure 580 to form the source structure 580 therefrom. The source structure 580 may correspond to remaining (e.g., unremoved) portions of the doped material 204. As another non-limiting example, at least partially depending on the material composition and thickness of the doped material 204, the doped material 204 may be converted into another conductive material and patterned (e.g., etched) to form the source structure 580.

A thickness (e.g., in the Z-direction) of the source structure 580 may be within a range from about 50 nm to about 75 nm, from about 75 nm to about 100 nm, from about 100 nm to about 200 nm, from about 200 nm to about 400 nm, or from about 400 nm to about 500 nm.

After forming the source structure 580, a back end of the line structure 595 may be formed over the source structure 580. For example, second interconnect structures 582 may be formed over and in electrical communication with the source structure 580. The second interconnect structures 582 may be formed of and include conductive material, such as tungsten. An opening may be formed through the insulative material 206 and the source structure 580 to separate portions of the source structure 580 (e.g., portions in electrical communication with the memory cells 424 from portions in electrical communication with the deep contact structures 416). An insulative material 584 may be formed over the second interconnect structures 582 and the source structure 580.

First metallization structures 586 may be formed vertically over (e.g., in the Z-direction) and in electrical communication with the second interconnect structures 582. The first metallization structures 586 may be formed of and include a conductive material, such as copper. Third interconnect structures 588 may be formed over and in electrical communication with the first metallization structures 586 and electrically couple the first metallization structures 586 to second metallization structures 592. The third interconnect structures 588 may be formed of and include a conductive material, such as copper. The third metallization structures 590 may be formed of and include conductive material, such as aluminum. A passivation material may be formed over the microelectronic device structure assembly 550 to electrically isolate the second metallization structures 592.

Although FIG. 4C and FIG. 5B have been described and illustrated as removing the base materials 102, 202, 302 by grinding and subsequent etching, the disclosure is not so limited. In other embodiments, the base materials 102, 202, 302 may be removed based on the crystalline orientation of the base materials 102, 202, 302 and orientation selective etching of the base materials 102, 202, 302 using one or more wet etchants, such as KOH, NaOH, and TMAH. FIG. 6A is a simplified cross-sectional view illustrating a microelectronic device structure assembly 650 including a first microelectronic device structure 600 attached to a second microelectronic device structure 660. The second microelectronic device structure 660 may be substantially similar to the second microelectronic device structure 460 described above with reference to FIG. 4B. The first microelectronic device structure 600 may be substantially similar any of the first microelectronic device structures 400, 500 described above with reference to FIG. 4A through FIG. 5C. The first microelectronic device structure 600 may be attached to the second microelectronic device structure 660 as described above with reference to attachment of the first microelectronic device structures 400, 500 to the second microelectronic device structure 460.

The first microelectronic device structure 600 may include any of the base structures 100, 200, 300 described above with reference to FIG. 1A through FIG. 3C. With reference to FIG. 6A, the first microelectronic device structure 600 may include a base material 602 comprising one or more of the materials described above with reference to the base material 102 (FIG. 1A). In some embodiments, the base material 602 comprises silicon.

In some embodiments, a protective material 604 may be formed around at least a portion of the microelectronic device structure assembly 650. For example, the protective material 604 may be disposed around the second microelectronic device structure 660. In some embodiments, the protective material 604 is disposed between the first microelectronic device structure 600 and the second microelectronic device structure 660, such as in a region 606 between bevels of the first microelectronic device structure 600 and the second microelectronic device structure 660.

The protective material 604 an insulative material. In some embodiments, the protective material 604 is formed of and includes silicon dioxide.

Figure 6B:
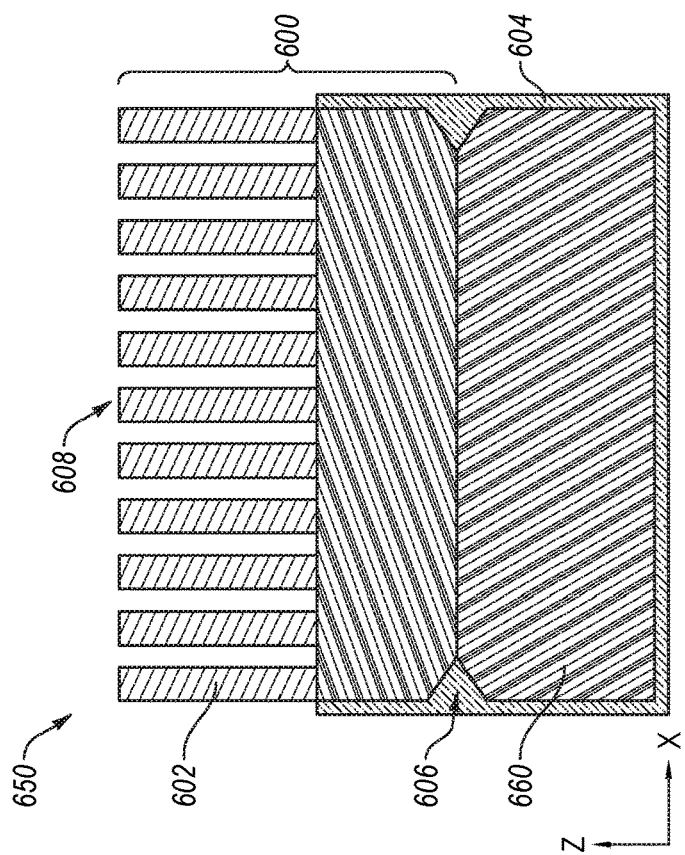
FIG. 6A and FIG. 6B are simplified cross-sectional views illustrating a method of forming a microelectronic device structure assembly, in accordance with additional embodiments of the disclosure.
Figure 6A:
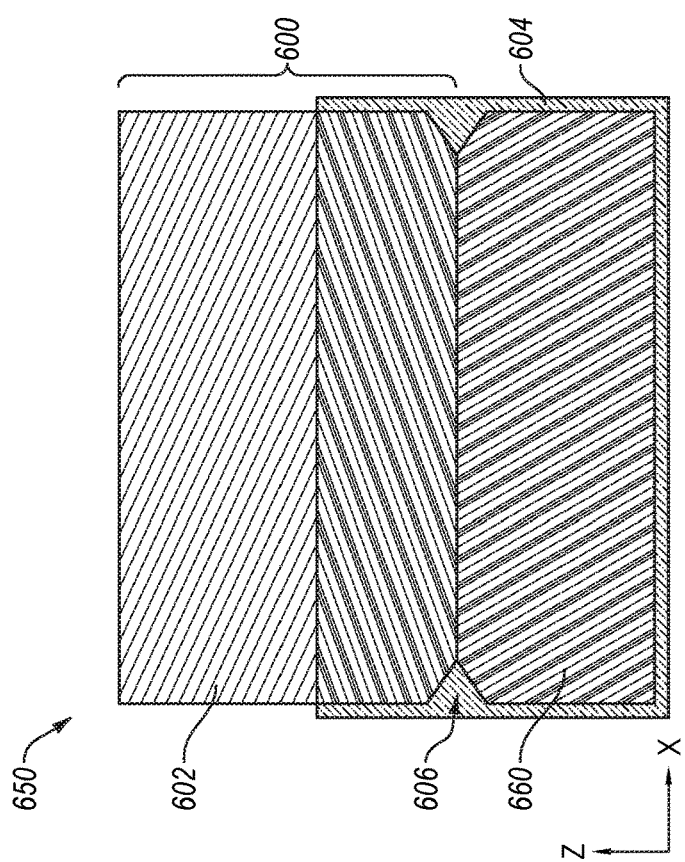

Referring to FIG. 6B, the base material 602 may be removed (e.g., detached) from the first microelectronic device structure 600. In some embodiments, the base material 602 is patterned to expose the {100} plane or the {110} plane of the base material 602. The base material 602 may be exposed to one or more etchants formulated to remove the base material 602 along the {100} plane or the {110} plane, which may form trenches 608 in the base material 602. In some embodiments, the trenches 608 may be patterned with i-line photolithography. In some embodiments, a mask is formed over the base material 602 and slits are formed through the mask to expose portions of the base material 602. The base material 602 is exposed to the one or more etchants through the openings in the mask material. The one or more etchants may include one or both of potassium hydroxide and tetramethylammonium hydroxide. In some embodiments, the etchant comprises potassium hydroxide.

After forming the trenches 608, the remaining portions of the base material 602 may be removed by exposing the base material to one or more etchants configured to selectively remove the base material 602 without substantially removing materials underlying the base material 602 (e.g., the etch stop material 104 (FIG. 1C), the doped material 204 (FIG. 2C)). The remaining portions of the base material 602 may be selectively removed with respect to materials underlying the base material 602 as described above.

Removing the base material 602 by forming the trenches 608 may facilitate improved removal of the base material 602 relative to other methods of removal of the base material. Since the trenches 608 are formed by i-line photolithography, the trenches 608 may be removed with relatively low cost methods. In addition, since the base material 602 is removed based on the orientation of the base material 602, the removal thereof may be at a relatively faster rate than other removal processes. Further, since the base material 602 is not removed by grinding, the microelectronic device structure assembly 650 may not be exposed to particles generated from the grinding process.

After removal of the base material 602, a source structure (e.g., the source structure 580) may be formed over the first microelectronic device structure 600, as described above with reference to FIG. 5C.

Although FIG. 4C, FIG. 5B, and FIG. 6B have been described and illustrated as removing the base materials 102, 202, 302, 602 with particular methods, the disclosure is not so limited. In other embodiments, the base materials 102, 202, 302, 602 may be formed to include hydrogen atoms at a desired depth prior to formation of the memory array region 404 and attachment of the first microelectronic device structures 400, 500, 600 to the second microelectronic device structures 460, 660. After attachment of the first microelectronic device structure 400, 500, 600 to the respective second microelectronic device structure 460, 660, the respective base material 102, 202, 302, 602 may be removed by fracturing the base material 102, 202, 302, 602 at locations corresponding to the implanted hydrogen atoms.

Forming the microelectronic device structure assemblies 450, 550, 650 according to the methods described herein may facilitate improved fabrication of microelectronic devices. For example, forming the first microelectronic device structures 400, 500, 600 to include the base structures 100, 200, 300 prior to attaching the first microelectronic device structures 400, 500, 600 to the second microelectronic device structure 460 may facilitate improved fabrication of the microelectronic device structure assemblies 450, 550, 650. Formation of the base structures 100, 200, 300 prior to attaching the first microelectronic device structures 400, 500, 600 to the second microelectronic device structure 460 facilitates formation of the material of the source structure (e.g., the source structure 480, 580) prior to attaching the first microelectronic device structures 400, 500, 600 to the second microelectronic device structure 460. In addition, the base structures 100, 200, 300 may be fabricated with various materials to facilitate selective removal of the base material 102, 202, 302 after attaching the first microelectronic device structures 400, 500, 600 to the second microelectronic device structure 460 and without damaging other components or structures of the respective microelectronic device structure assemblies 450, 550, 650. Further, the methods described above facilitate fabrication of the second microelectronic device structure 460 (e.g., a CMOS wafer including control logic circuitry for one or more components of the first microelectronic device structures 400, 500, 600) separate from the fabrication of the first microelectronic device structures 400, 500, 600 (e.g., prior to attaching the first microelectronic device structures 400, 500, 600 to the second microelectronic device structure 460).

Thus, in accordance with some embodiments of the disclosure, a method of forming a microelectronic device comprises forming a source material around substantially an entire periphery of a base material, and removing the source material from lateral sides of the base material while maintaining the source material over an upper surface and a lower surface of the base material.

Furthermore, in accordance with additional embodiments of the disclosure, a method of forming a microelectronic device comprises forming a doped semiconductive material over a base material, forming an insulative material over the doped semiconductive material, forming openings in the insulative material and exposing the doped semiconductive material through the openings, and epitaxially growing additional semiconductive material from the doped semiconductive material to fill the openings and cover the insulative material.

Moreover, in accordance with further embodiments of the disclosure, a base structure for a microelectronic device comprises a base material comprising one or more of a semiconductive material, a ceramic material, and a glass material, and a doped semiconductive material overlying an upper surface of the base material and underlying a lower surface of the base material, side surfaces of the base material interposed between the upper surface and the lower surface of the base material substantially free of the doped semiconductive material.

In addition, a base structure for a microelectronic device structure according to embodiments of the disclosure comprises a base material comprising one or more of semiconductive material, ceramic material, and glass material, a doped semiconductive material on the base material, a dielectric material on the doped semiconductive material, filled openings extending through dielectric material to the doped semiconductive material, and an epitaxial semiconductive material substantially filling the filled openings and covering surfaces of the dielectric material outside of the filled openings.

In further embodiments, a base structure for a microelectronic device comprises a base material comprising one or more of a semiconductive material, a ceramic material, and a glass material, doped polysilicon on a first side of the base material and on a second, opposite side of the base material, and a dielectric material adjacent side surfaces of the doped polysilicon on one of the first side and the second side of the base material.

Figure 7:
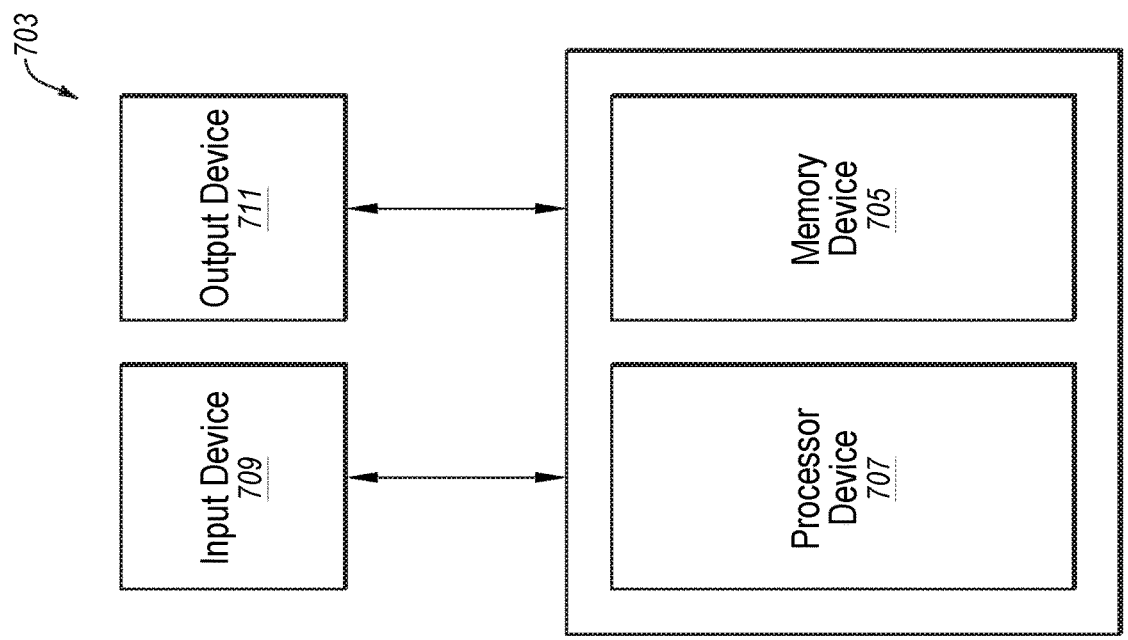
FIG. 7 is a block diagram of an electronic system, in accordance with embodiments of the disclosure.

Microelectronic devices including microelectronic device structures (e.g., the first microelectronic device structures 400, 500, 600) and microelectronic device structure assemblies (e.g., the microelectronic device structure assemblies 450, 550, 650) including the base structures (e.g., the base structures 100, 200, 300) may be used in embodiments of electronic systems of the disclosure. For example, FIG. 7 is a block diagram of an electronic system 703, in accordance with embodiments of the disclosure. The electronic system 703 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 703 includes at least one memory device 705. The memory device 705 may include, for example, an embodiment of a microelectronic device structure previously described herein (e.g., the first microelectronic device structures 400, 500, 600) or a microelectronic device (e.g., the microelectronic device structure assemblies 450, 550, 650 previously described with reference to FIG. 4A through FIG. 6B) including the including the base structures 100, 200, 300.

The electronic system 703 may further include at least one electronic signal processor device 707 (often referred to as a "microprocessor"). The electronic signal processor device 707 may, optionally, include an embodiment of a microelectronic device or a microelectronic device structure previously described herein (e.g., one or more of the first microelectronic device structures 400, 500, 600 or the microelectronic device structure assemblies 450, 550, 650 previously described with reference to FIG. 4A through FIG. 6B). The electronic system 703 may further include one or more input devices 709 for inputting information into the electronic system 703 by a user, such as, for example, a mouse or other pointing device, a keyboard, a touchpad, a button, or a control panel. The electronic system 703 may further include one or more output devices 711 for outputting information (e.g., visual or audio output) to a user such as, for example, a monitor, a display, a printer, an audio output jack, a speaker, etc. In some embodiments, the input device 709 and the output device 711 may comprise a single touchscreen device that can be used both to input information to the electronic system 703 and to output visual information to a user. The input device 709 and the output device 711 may communicate electrically with one or more of the memory device 705 and the electronic signal processor device 707.

Figure 8:
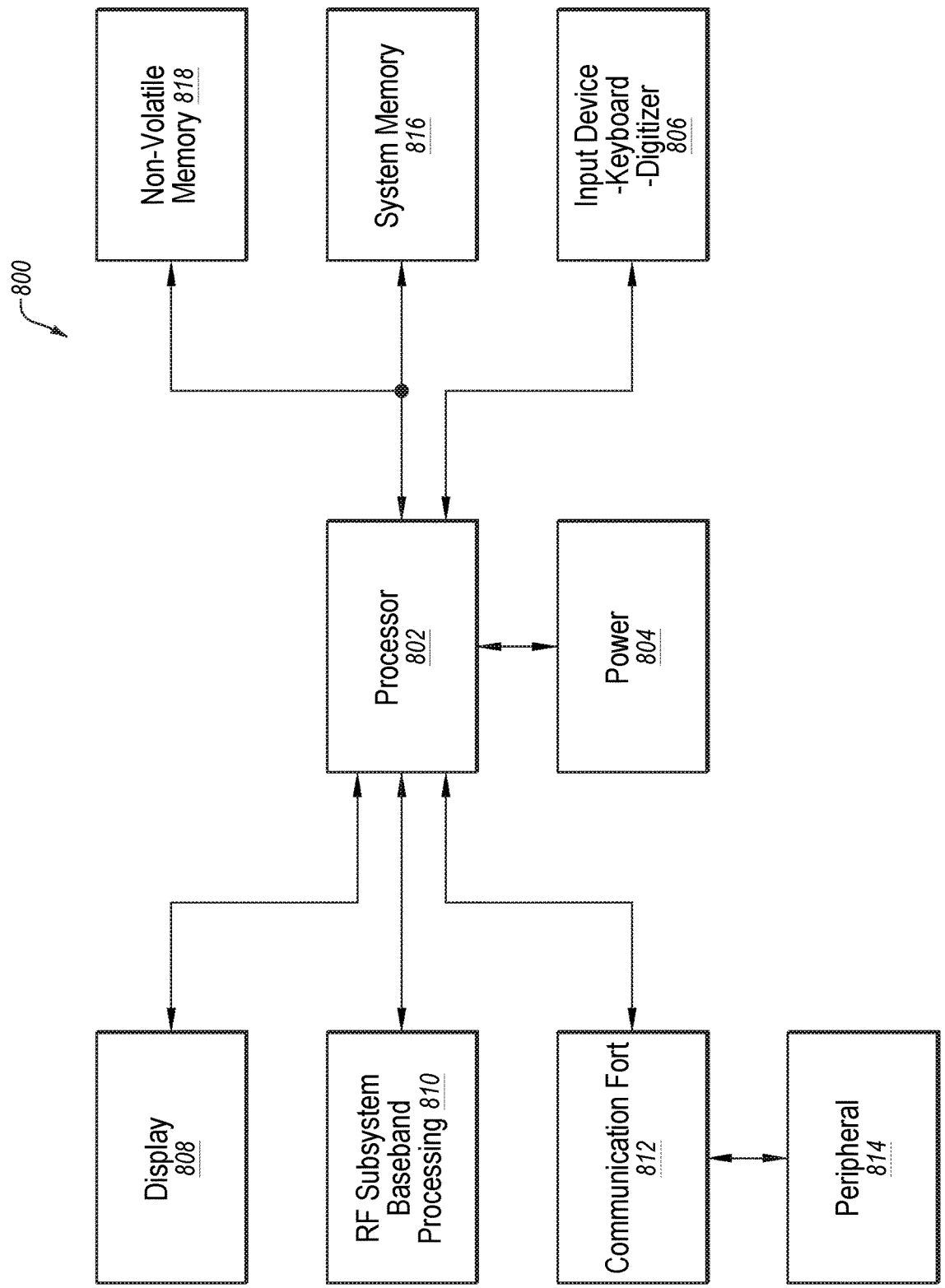
FIG. 8 is a block diagram of a processor-based system, in accordance with embodiments of the disclosure.

With reference to FIG. 8, depicted is a processor-based system 800. The processor-based system 800 may include microelectronic device structures (e.g., the first microelectronic device structures 400, 500, 600) and microelectronic device structure assemblies (e.g., the microelectronic device structure assemblies 450, 550, 650) manufactured in accordance with embodiments of the present disclosure. The processor-based system 800 may be any of a variety of types such as a computer, pager, cellular phone, personal organizer, control circuit, or other electronic device. The processor-based system 800 may include one or more processors 802, such as a microprocessor, to control the processing of system functions and requests in the processor-based system 800. The processor 802 and other subcomponents of the processor-based system 800 may include microelectronic devices and microelectronic device structures (e.g., microelectronic devices and microelectronic device structures including one or more of the first microelectronic device structures 400, 500, 600 or the microelectronic device structure assemblies 450, 550, 650) manufactured in accordance with embodiments of the present disclosure.

The processor-based system 800 may include a power supply 804 in operable communication with the processor 802. For example, if the processor-based system 800 is a portable system, the power supply 804 may include one or more of a fuel cell, a power scavenging device, permanent batteries, replaceable batteries, and rechargeable batteries. The power supply 804 may also include an AC adapter; therefore, the processor-based system 800 may be plugged into a wall outlet, for example. The power supply 804 may also include a DC adapter such that the processor-based system 800 may be plugged into a vehicle cigarette lighter or a vehicle power port, for example.

Various other devices may be coupled to the processor 802 depending on the functions that the processor-based system 800 performs. For example, a user interface 806 may be coupled to the processor 802. The user interface 806 may include input devices such as buttons, switches, a keyboard, a light pen, a mouse, a digitizer and stylus, a touch screen, a voice recognition system, a microphone, or a combination thereof. A display 808 may also be coupled to the processor 802. The display 808 may include an LCD display, an SED display, a CRT display, a DLP display, a plasma display, an OLED display, an LED display, a three-dimensional projection, an audio display, or a combination thereof. Furthermore, an RF sub-system/baseband processor 810 may also be coupled to the processor 802. The RF sub-system/baseband processor 810 may include an antenna that is coupled to an RF receiver and to an RF transmitter (not shown). A communication port 812, or more than one communication port 812, may also be coupled to the processor 802. The communication port 812 may be adapted to be coupled to one or more peripheral devices 814, such as a modem, a printer, a computer, a scanner, or a camera, or to a network, such as a local area network, remote area network, intranet, or the Internet, for example.

The processor 802 may control the processor-based system 800 by implementing software programs stored in the memory. The software programs may include an operating system, database software, drafting software, word processing software, media editing software, or media playing software, for example. The memory is operably coupled to the processor 802 to store and facilitate execution of various programs. For example, the processor 802 may be coupled to system memory, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 816 may include volatile memory, non-volatile memory, or a combination thereof. The system memory 816 is typically large so that it can store dynamically loaded applications and data. In some embodiments, the system memory 816 may include semiconductor devices, such as the microelectronic devices and microelectronic device structures (e.g., the first microelectronic device structures 400, 500, 600 and the microelectronic device structure assemblies 450, 550, 650) described above, or a combination thereof.

The processor 802 may also be coupled to non-volatile memory 818, which is not to suggest that system memory 816 is necessarily volatile. The non-volatile memory 818 may include one or more of STT-MRAM, MRAM, read-only memory (ROM) such as an EPROM, resistive read-only memory (RROM), and flash memory to be used in conjunction with the system memory. The size of the non-volatile memory 818 is typically selected to be just large enough to store any necessary operating system, application programs, and fixed data. Additionally, the non-volatile memory 818 may include a high-capacity memory such as disk drive memory, such as a hybrid-drive including resistive memory or other types of non-volatile solid-state memory, for example. The non-volatile memory 818 may include microelectronic devices, such as the microelectronic devices and microelectronic device structures (e.g., the first microelectronic device structures 400, 500, 600 and the microelectronic device structure assemblies 450, 550, 650) described above, or a combination thereof.

Accordingly, in at least some embodiments, an electronic system comprises an input device, an output device, a processor device operably coupled to the input device and the output device, and a memory device operably coupled to the processor device and comprising at least one microelectronic device structure assembly. The at least one microelectronic device structure assembly comprises a first microelectronic device structure comprising a back end of the line structure comprising metallization materials in electrical communication with a source structure, a memory array region comprising strings of memory cells extending through a stack structure comprising alternating levels of insulative structures and conductive structures, and an interconnect region including bond pad structures in electrical communication with the memory array region. The electronic system further comprises a second microelectronic device structure comprising CMOS circuitry in electrical communication with the bond pad structures.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming a microelectronic device, the method comprising:
    forming a source material around substantially an entire periphery of a base material; and
    removing the source material from lateral sides of the base material while maintaining the source material over an upper surface and a lower surface of the base material.

2. The method of claim 1, further comprising forming an etch stop material over the base material prior to forming the source material around substantially the entire periphery of the base material.

3. The method of claim 2, further comprising:
    selecting the base material to comprise a semiconductive material; and
    selecting the etch stop material to comprise a dielectric material.

4. The method of claim 2, further comprising:
    selecting the base material to comprise a silicon material; and
    selecting the etch stop material to comprise silicon dioxide.

5. The method of claim 1, further comprising forming a protective material on lateral sides of remaining portions of source material after removing the source material from the lateral sides of the base material.

6. The method of claim 1, further comprising selecting the base material to comprise one or more of monocrystalline silicon, polycrystalline silicon, silicon-germanium, germanium, gallium arsenide, a gallium nitride, gallium phosphide, indium phosphide, indium gallium nitride, and aluminum gallium nitride.

7. The method of claim 1, further comprising selecting the source material to comprise doped polysilicon.

8. The method of claim 1, further comprising selecting the base material to comprise a ceramic material.

9. The method of claim 8, wherein selecting the base material to comprise a ceramic material comprises selecting the base material to comprise silicon on poly-aluminum nitride.

10. The method of claim 1, further comprising selecting the base material to comprise a glass material.

11. The method of claim 10, wherein selecting the base material to comprise a glass material comprises selecting the base material to comprise one or more of borosilicate glass, phosphosilicate glass, fluorosilicate glass, borophosphosilicate glass, aluminosilicate glass, an alkaline earth boro-aluminosilicate glass, quartz, titania silicate glass, and soda-lime glass.

12. The method of claim 1, further comprising:
    forming a stack structure comprising a vertically alternating series of conductive structures and insulative structures over the source material;
    forming vertically extending strings of memory cells within the stack structure to form a first microelectronic device structure;
    attaching the first microelectronic device structure to a second microelectronic device structure comprising control logic circuitry to form a microelectronic device structure assembly;
    removing the base material after forming the microelectronic device structure assembly; and
    forming circuitry in electrical communication with the source material after removing the base material.

13. The method of claim 12, wherein removing the base material comprises one or more of grinding and wet etching the base material.

14. A method of forming a microelectronic device, the method comprising:
    forming a doped semiconductive material over a base material;
    forming an insulative material over the doped semiconductive material;

forming openings in the insulative material and exposing the doped semiconductive material through the openings; and epitaxially growing additional semiconductive material from the doped semiconductive material to fill the openings and cover the insulative material.

15. The method of claim 14, wherein forming a doped semiconductive material over a base material comprises forming the doped semiconductive material to comprise a semiconductive material of the base material doped and one or more dopants dispersed within the semiconductive material.

16. The method of claim 14, further comprising:
forming a stack structure comprising vertically alternating series of conductive structures and insulative structures over the additional semiconductive material;
forming vertically extending strings of memory cells within the stack structure to form a first microelectronic device structure;
coupling the first microelectronic device structure to a second microelectronic device structure comprising control logic circuitry to form a microelectronic device structure assembly; and
removing the base material after forming the microelectronic device structure assembly.

17. The method of claim 16, wherein removing the base material comprises removing the base material without substantially removing the doped semiconductive material.

18. The method of claim 16, wherein removing the base material comprises forming trenches in the base material along a {100} plane or a {110} plane of the base material.

19. The method of claim 16, further comprising forming a source structure over the additional semiconductive material after removing the base material.

20. The method of claim 16, further comprising forming a protecting material in a region between bevels of the first microelectronic device structure and the second microelectronic device structure.

* * * * *

UNITED STATES PATENT AND TRADEMARK OFFICE
CERTIFICATE OF CORRECTION

| | |
|---|---|
| PATENT NO. | : 11,380,669 B2 |
| APPLICATION NO. | : 16/905734 |
| DATED | : July 5, 2022 |
| INVENTOR(S) | : Kunal R. Parekh |

It is certified that error appears in the above-identified patent and that said Letters Patent is hereby corrected as shown below:

In the Specification

| | | |
|---|---|---|
| Column 2, | Line 29, | change "memory army" to --memory array-- |
| Column 15, | Line 33, | change "etching (ME)" to --etching (RIE)-- |

Signed and Sealed this
Third Day of January, 2023

Katherine Kelly Vidal
*Director of the United States Patent and Trademark Office*